(12) United States Patent
Chang et al.

(10) Patent No.: US 6,242,769 B1
(45) Date of Patent: Jun. 5, 2001

(54) THIN FILM TRANSISTOR TYPE PHOTO SENSOR

(75) Inventors: Youn Gyoung Chang; Jeong Hyun Kim, both of Kunpo; Se June Kim, Seoul; Jae Kyun Lee, Anyang; Jong Hoon Yi, Seoul, all of (KR)

(73) Assignee: L. G. Philips LCD Co., Ltd., Seoul (KR)

( * ) Notice: Subject to any disclaimer, the term of this patent is extended or adjusted under 35 U.S.C. 154(b) by 0 days.

(21) Appl. No.: 09/453,299

(22) Filed: Dec. 3, 1999

(30) Foreign Application Priority Data

Dec. 4, 1998 (KR) .................................................. 98-58122

(51) Int. Cl.[7] ....................... H01L 31/062; H01L 31/113; H01L 27/108; H01L 29/76; H01L 29/94
(52) U.S. Cl. .............................. 257/291; 257/59; 257/72; 257/292; 257/294; 257/296; 257/350
(58) Field of Search .................................. 257/59, 72, 291, 257/292, 294, 296, 350

(56) References Cited

U.S. PATENT DOCUMENTS 5,998,841 * 12/1999 Suzawa ................................. 257/350

* cited by examiner

*Primary Examiner*—Ngân V. Ngô
(74) *Attorney, Agent, or Firm*—Long Aldridge & Norman, LLP

(57) ABSTRACT

A TFT type optical detecting sensor includes a sensor TFT for generating optical current by detecting light reflected from an object, a storage capacitor for storing charges of the optical current, and a switching TFT for controlling releasing of the charges stored in the storage capacitor. The storage capacitor is made of a transparent conductive material, such that light is transmitted from a light source through the storage capacitor to the object.

10 Claims, 4 Drawing Sheets

THIN FILM TRANSISTOR TYPE PHOTO SENSOR

This application claims the benefit of Korean Patent Application No. 1998-53122, filed on Dec. 4, 1998, which is hereby incorporated by reference.

BACKGROUND OF THE INVENTION

1. Field of the Invention

The present invention relates to an optical detecting sensor and, more particularly, to a thin film transistor (TFT) type optical detecting sensor.

2. Description of the Related Art

Generally, optical detecting sensors are used in facsimile and digital copying machines, and in fingerprint recognition systems as an image reader. In recent years, a TFT type optical detecting sensor has been suggested. The TFT changes its electrical characteristics in response to incident light. A TFT type optical detecting sensor is a system using such a TFT having such a characteristic.

FIG. 1 shows a plan view of a conventional TFT type optical detecting sensor and FIG. 2 shows a sectional view taken along line II—II of FIG. 1.

As shown in the drawings, an optical detecting sensor 100 comprises a window 8 through which light generated from a light source 102 passes and a sensor TFT 6 for generating optical current by detecting the light which is transmitted through the window 8 and then reflected from an object 12.

Since the optical detecting sensor 100 is designed to detect the light passing through the window and reflected from the object 12, it is essential that the window 8 has a sufficient light passing area. In addition, since a storage capacitor 4 for storing charges generated by the reflected light has to maintain a predetermined capacity, it is also essential to provide a sufficient storage area to the storage capacitor 4.

As shown in FIG. 1, a pixel of the optical detecting sensor 100 is comprised of a storage capacitor 4 and a switching TFT 2 in addition to the window 8 and the sensor TFT 6. Generally, an area of one pixel defined by $A_1 * (B_1 + 2B_1')$, where $A_1$ is defined by a sum of $C_1$, $D_1$, $E_1$, and $F_1$. Accordingly, an area of the window 8 can be defined by $(B_1 + 2B_1') * F_1$, and an area of the storage capacitor 4 can be defined by $(B_1 + 2B_1') * D_1$.

The optical detecting sensor 100 will be described more in detail with reference to FIG. 2.

In FIG. 2, the switching TFT, the storage capacitor, the sensor TFT, and window are defined by regions 2, 4, 6 and 8, respectively.

A first metal layer is formed on a substrate 1. The first metal layer comprises a gate electrode 20 of the switching TFT 2, a first storage electrode 30 of the storage capacitor 4, and a gate electrode of the sensor TFT 6. The first metal layer is made of a material selected from the group consisting of W, Mo, Cr and Al.

In addition, a gate insulating layer 14 is disposed on the first metal layer, and a semiconductor layer is deposited on the gate insulating layer 14. The semiconductor layer is patterned such that semiconductor elements 26 and 46 are formed to act as an active layer of the switching TFT 2 and the sensor TFT 6, respectively.

A second metal layer is deposited and patterned to form drain electrode 24 and source electrode 22 on the active layer of the switching TFT 2, a second storage electrode 34 for the storage capacitor 4, and drain electrode 44 and source electrode 42 on the active layer of the sensor TFT 6.

An insulating layer 16 is formed to protect the switching TFT 2, the storage capacitor 4 and the sensor TFT 6. A light interrupting layer 18 is formed on a portion of the protecting insulating layer 16 corresponding to the switching TFT 2 to block light scattered from the object 12, and a protecting layer 10 is deposited on the insulating layer 16 and covers the light interrupting layer 18.

Generally, an active layer 46 of the sensor TFT 6 is made of a-Si:H which has a low dark conductivity and a high optical conductivity.

Since the sensor TFT 6 is operated by optical current in accordance with the intensity of incident light in an off-state, negative voltage is always applied to the gate electrode 40 to maintain the off-state. An optical current is generated in proportion to the intensity of the incident light, and is directed to the second storage electrode 34 of the storage capacitor 4 through the source electrode 42, and then stored in the storage capacitor 4 as charges.

Furthermore, when a bias voltage is applied to the gate electrode 20 of the switching TFT, the charges stored in the storage capacitor 4 are conducted to the source electrode 22 through the drain electrode 24 of the switching TFT 2.

In the above-described sensor, in order to receive more light, the area of the window 8 should be maximized.

It is also necessary to increase the capacity of the storage capacitor in order to store more charges.

SUMMARY OF THE INVENTION

Accordingly, the present invention is directed to thin film transistor (TFT) type photo sensor that substantially obviates one or more of the problems due to limitations and disadvantages of the related art.

Therefore, it is an object of the present invention to provide a TFT type optical detecting sensor in which the areas of a storage capacitor and a window are maximized, thereby improving the signal to noise ratio (S/N).

To achieve the above object, the present invention provides a TFT type optical detecting sensor which can read an image of an object by reflected light from the object, comprising a light source, a sensor TFT for generating optical current by detecting light reflected from the object, a storage capacitor for transmitting light from the light source to the object and for storing charges of the optical current, and a switching TFT for controlling the release of the charges stored in the storage capacitor, wherein the storage capacitor is made of a transparent conductive material.

Preferably, the transparent conductive material is selected from the group consisting of ITO, TiO and $SnO_2$.

The sensor TFT is preferably disposed on a central portion of the storage capacitor.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWING

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiment of the present invention, example of which is illustrated in the accompanying drawings.

Figure 3:
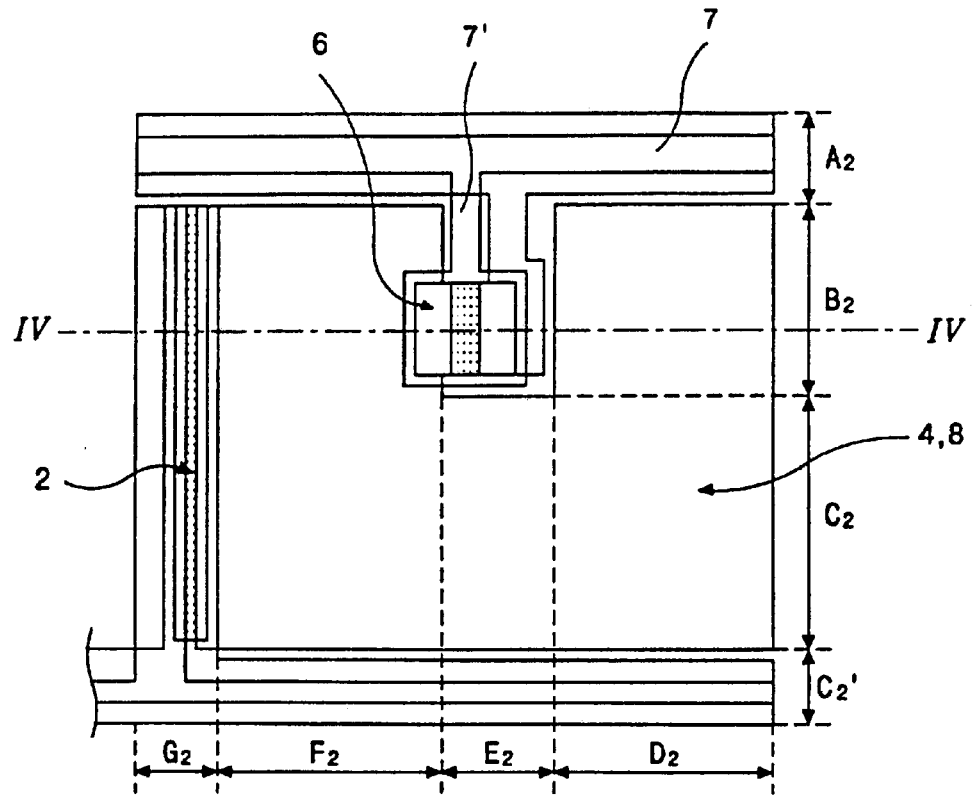
FIG. 3 is a plan view illustrating a pixel of a TFT type optical detecting sensor according to a first embodiment of the present invention.
Figure 4:
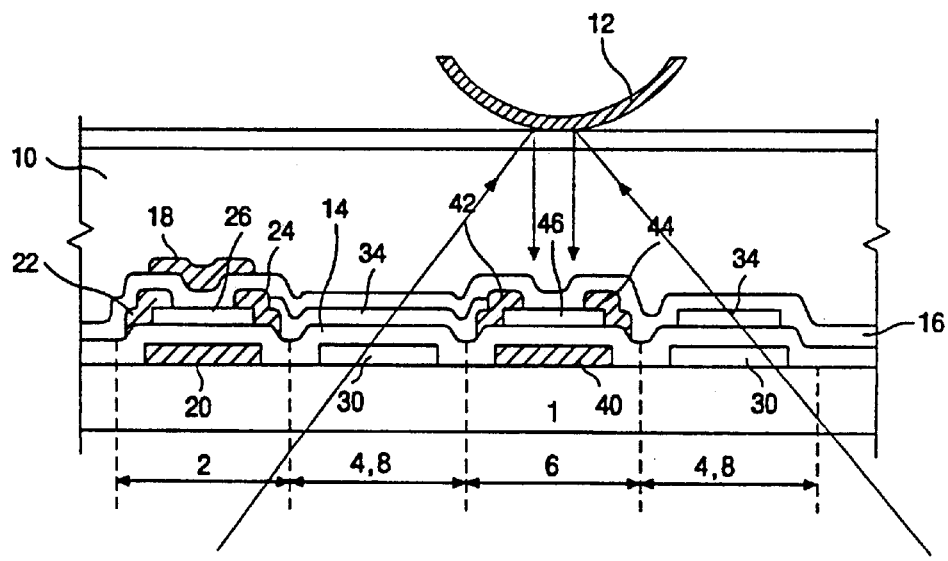
FIG. 4 is a sectional view taken along line IV—IV of FIG. 3.

FIG. 3 shows a plan view illustrating a pixel of a TFT type optical detecting sensor according to a first embodiment of the present invention, and FIG. 4 shows a sectional view taken along line IV—IV of FIG. 3.

As shown in FIG. 3, a switching TFT 2 is formed along one side of a pixel of an optical detecting sensor. A gate wire 7 which is connected to a sensor TFT 6 by a gate connection line 7' is formed along another side of the pixel. The sensor TFT 6 is preferably disposed near the center of the pixel.

A window 8 and a storage capacitor 4 are defined by a portion excluding the switching TFT 2, the gate wire 7 and the gate electrode 7'. The storage capacitor 4 functions as the window 8.

The optical detecting sensor of the first embodiment of the present invention will be described in greater detail with reference to FIG. 4.

The switching TFT 2 is comprised of a gate electrode 20, a gate insulating layer 14, a semiconductor layer 26, a drain electrode 24, and a source electrode 22. The sensor TFT 6 is also comprised of a gate electrode 40, a gate insulating layer 14, a semiconductor layer 46, a drain electrode 44, and a source electrode 42.

In addition, the switching TFT 2 is further provided with a light shielding layer 18 disposed on an insulating layer 16 over the semiconductor layer 26, to block light.

Preferably, the semiconductor layer 26 of the switching TFT 2 is made of polysilicon, which has a high electric field effect mobility when compared with amorphous silicon. The high electric field effect mobility allows the switching TFT 2 to be small, allowing an increase in the area of the window 8/storage capacitor 4.

The storage capacitor 4 is comprised of first and second storage electrodes 30 and 34 made of a transparent material, and a dielectric layer 14 disposed between the first and second storage electrodes 30 and 34. Charges stored in the storage capacitor 4 contain image information of the object. The transparent material is selected from the group consisting of ITO, TiO, and $SnO_2$.

Figure 1:
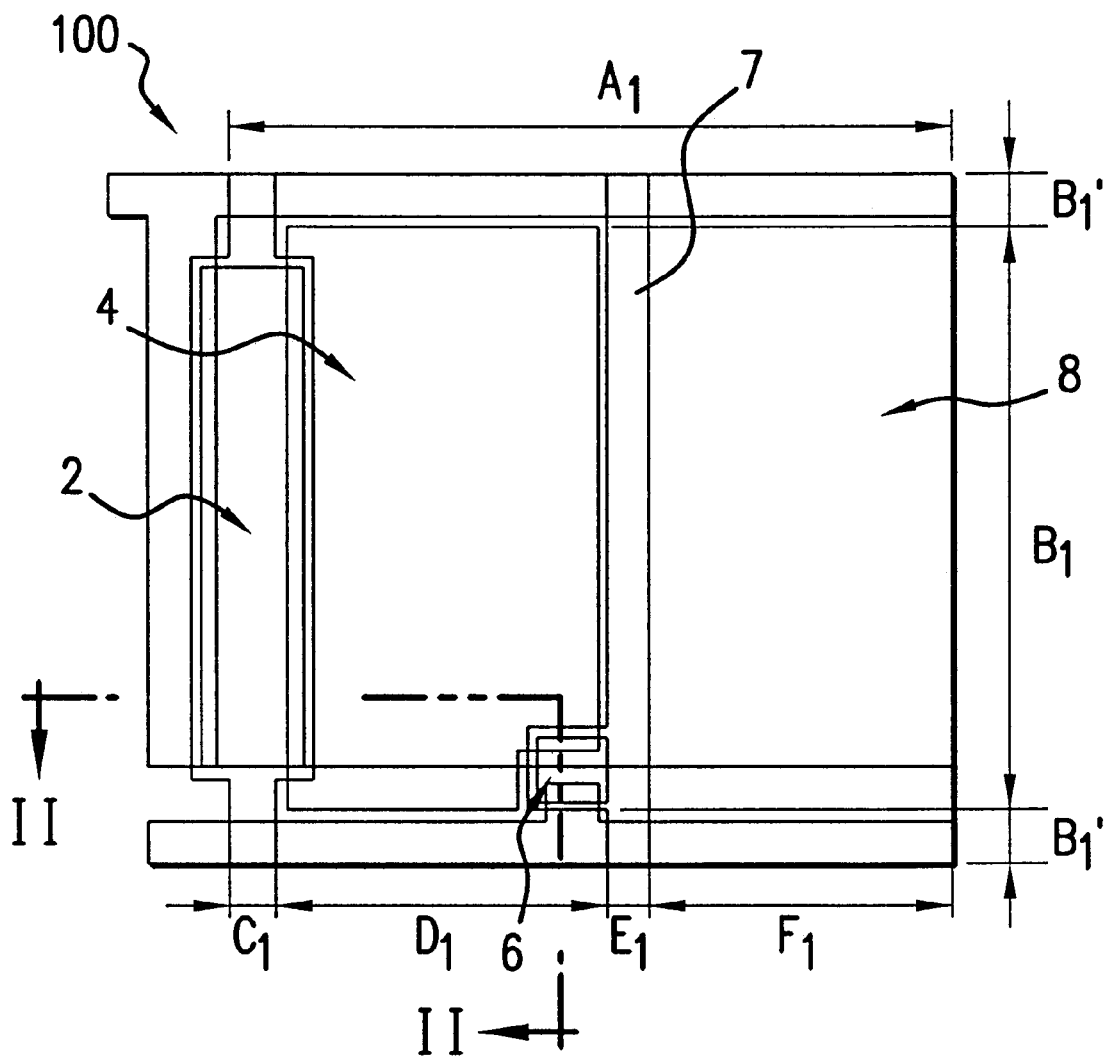
FIG. 1 is a plan view illustrating a pixel of a conventional optical detecting sensor.
Figure 2:
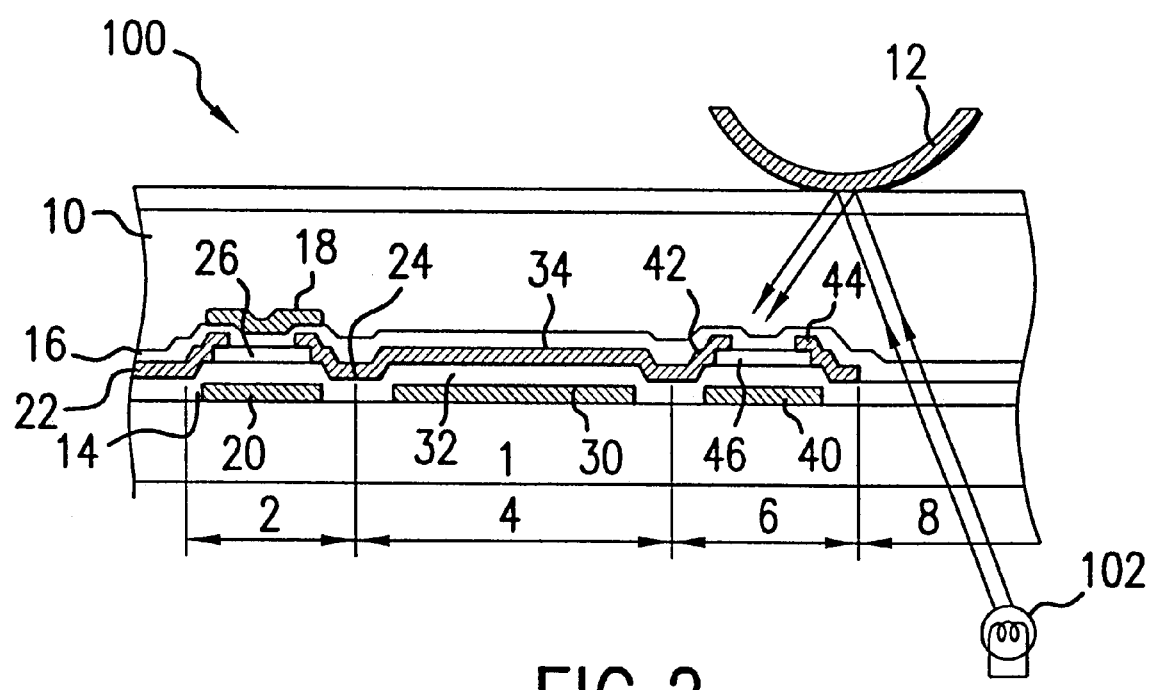
FIG. 2 is a sectional view taken along line II—II of FIG. 1.

In FIG. 3, when assuming that each length of $A_2$, $D_2$, $C_2'$ and $F_2$ is 10 μm each length of $B_2$, $C_2$, $E_2$, and $G_2$ is 15 μm, the area of the window 8 (and the storage capacitor 4) becomes about 825 $\mu m^2$. Thus that the area of the window 8 and storage capacitor 4 are each increased by 40% when compared with a conventional device having the same overall size, as shown in FIG. 1.

Accordingly, in FIGS. 3 and 4, since the amount of light which can pass through the window can be increased, the sensor TFT 6 can generate a large amount of optical current. And since a large amount of charges are stored in the storage capacitor 4, the signal to noise ratio (S/N) is increased.

Also, the gate wire 7 and gate electrode 7' connected to the sensor TFT 6 can be made of a transparent material in order to increase the transparent area of the pixel or window.

Furthermore, if the sensor TFT 6 is designed to be positioned in a central portion of the storage capacitor 4/window 8 by lengthening the gate electrode 7', light interference from the adjacent pixel can be reduced.

Figure 5:
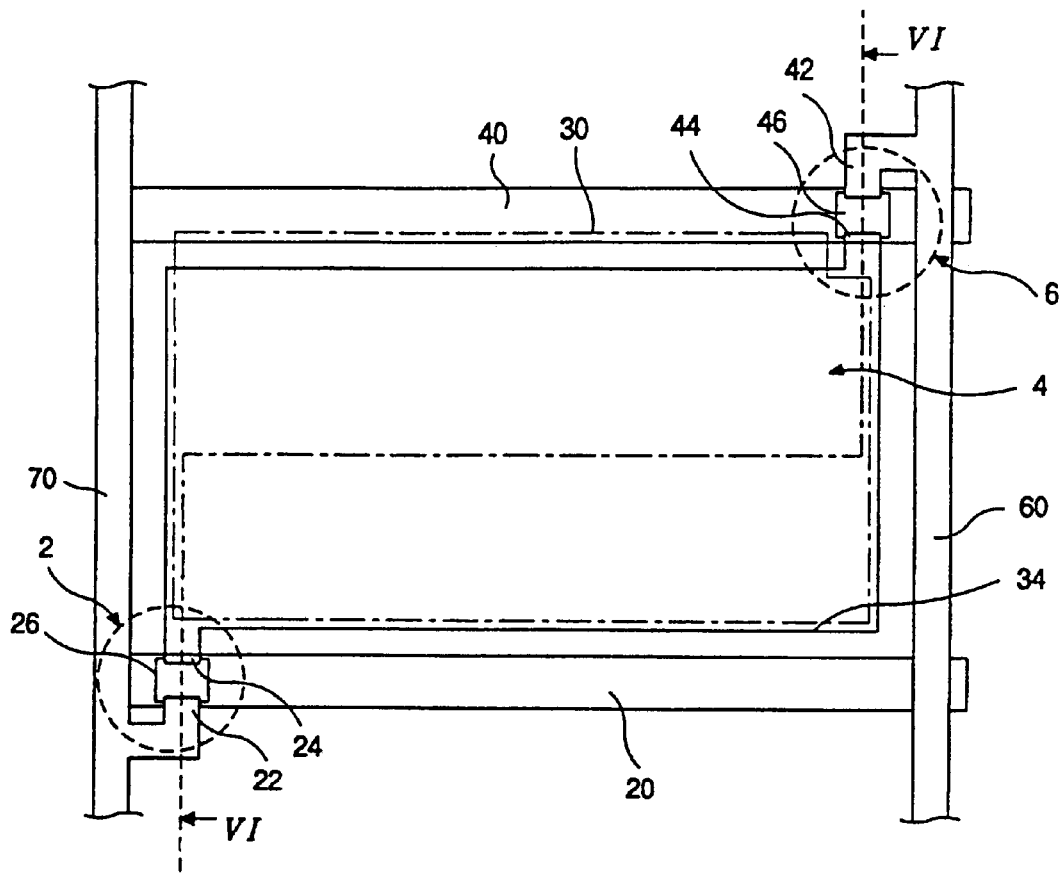
FIG. 5 is a plan view illustrating a pixel of a TFT type optical detecting sensor according to a second embodiment of the present invention.
Figure 6:
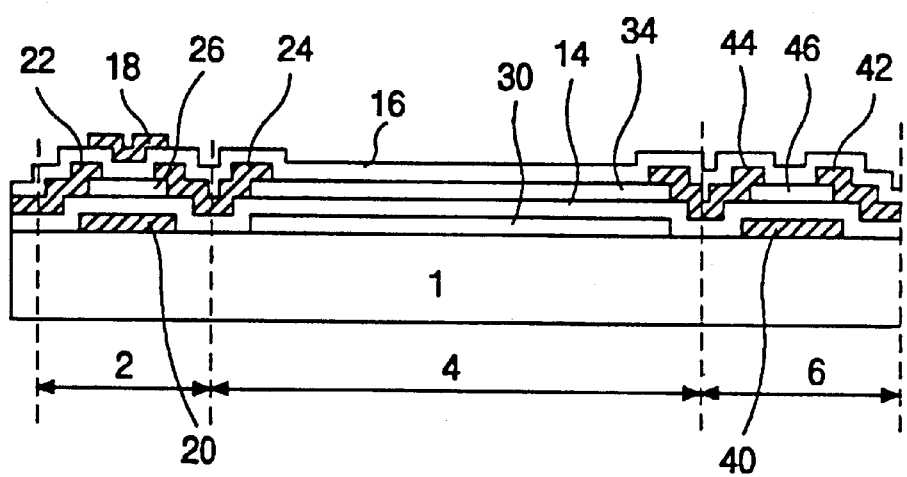
FIG. 6 is a sectional view taken along line VI—VI of FIG. 5.

FIGS. 5 and 6 show a TFT type optical detecting sensor according to a second embodiment of the present invention.

Referring first FIG. 5, a switching TFT 2 and a sensor TFT 6 are formed respectively at each corner a pixel of an optical detecting sensor, respectively. The switching TFT 2 is comprised of a gate wire 20, a semiconductor layer 26, and a source electrode 22. The sensor TFT 6 is comprised of a gate electrode 40, a semiconductor layer 46, and a drain electrode 42. A storage capacitor 4 comprising first storage electrode 30 and second storage electrode 34 is formed between the switching TFT 2 and the sensor TFT and 6.

The storage capacitor 4 is formed of a transparent material so that the storage capacitor 4 can also function as a window.

The optical detecting sensor of this second embodiment will be described in greater detail with reference to FIG. 6 taken along line VI—VI of FIG. 5.

First, a transparent material such as ITO, TiO and $SnO_2$ are deposited on a substrate 1, then patterned to form the first storage electrode 30.

Next, a first metal layer is deposited to form the gate electrodes 20 and 40 of the switching and sensor TFTs. The first metal layer is made of a material selected from the group consisting of Cr, Mo, Al, Ti, Sn, W and Cu.

At this point, the gate wire 7 connected to the sensor TFT 6 can be made of a transparent material in order to increase the transparent area of the pixel or window.

Next, an insulating layer 14, amorphous silicon (a-Si:H), and amorphous silicon doped with impurities are consecutively deposited, then patterned to form the semiconductor layers 26 and 46.

The semiconductor layers 26 and 46 each function as a path by which current flows through the TFTs 2 and 6, respectively.

In addition, the insulating layer 14 functions as a dielectric layer of the storage capacitor 4 and a gate insulating layer of the switching TFT 2 and sensor TFT 6.

Next, a transparent conductive material is deposited, then patterned to form the storage capacitor 4. That is, the patterned transparent conductive material functions as the second electrode 34 of the storage capacitor 4. The transparent conductive material is also selected from the group consisting of ITO, TiO and $SnO_2$.

Next, a second metal layer is deposited, then patterned to form the source electrodes 44, 24 and drain electrodes 22, 24 on the semiconductor layers 46 and 26, respectively. The second metal layer is also selected from the group consisting of Cr, Mo, Al, Sn, Ti, W and Cu. However, the second metal layer may be made of transparent material to increase light transmittivity.

Finally, an insulating layer 16 and a light shielding layer 18 are consecutively deposited.

A protecting layer may be further formed on the light shielding layer.

In this second embodiment, since the first and second storage electrodes 30 and 34 of the storage capacitor 4 are made of transparent conductive material, light from a light source can pass through the storage capacitor 4. Thus, a separate region dedicated for a window is not necessary and the whole area of the capacitor 4 serves as a window. This allows the sensor TFT 6 to generate a large amount of optical current, and a large amount of charges can be stored in the storage capacitor.

It will be apparent to those skilled in the art that various modifications and variation can be made in the thin film transistor type photo sensor of the present invention without departing from the spirit or scope of the invention. Thus, it is intended that the present invention cover the modifications and variations of this invention provided they come within the scope of the appended claims and their equivalents.

What is claimed is:

1. A thin film transistor (TFT) type optical detecting sensor which can sense an image of an object by detecting light reflected from the object, comprising:

a sensor TFT for generating an optical current in response to light reflected from the object;

a storage capacitor connected to the sensor TFT for transmitting light from a light source to the object and storing charges of the optical current; and a switching TFT connected to the storage capacitor for controlling a release of the charges stored in the storage capacitor.

2. The sensor of claim 1, wherein the storage capacitor comprises a transparent conductive material.

3. The sensor of claim 2, wherein the transparent conductive material is selected from a group consisting of ITO, TiO and $SnO_2$.

4. The sensor of claim 1, wherein the sensor TFT is disposed at a central portion of the storage capacitor.

5. The sensor of claim 1, wherein a gate wire of the sensor TFT is made of a transparent conductive material.

6. A thin film transistor (TFT) type optical detecting sensor which has a plurality of pixels and a light source, each pixel comprising:

a sensor TFT for generating an optical current in response to light from the light source reflected from an object;

a storage capacitor for storing charges of the optical current; and a switching TFT for controlling a release of the charges stored in the storage capacitor, wherein the storage capacitor is made of a transparent conductive material, and the storage capacitor transmits light from the light source to the object.

7. The TFT type optical detecting sensor of claim 6, wherein the transparent conductive material is selected from a group consisting of ITO, TiO and $SnO_2$.

8. The TFT type optical detecting sensor of claim 6, wherein the sensor TFT and the switching TFT are disposed respectively at opposing corners of the pixel.

9. A thin film transistor (TFT) image sensor, comprising:

a sensor TFT having a first electrode, a gate electrode, and a second electrode;

a switching TFT having a first electrode, a gate electrode, and a second electrode;

a storage capacitor having a first and second electrode, the first electrode of the storage capacitor being connected to the first electrode of the sensor TFT and the second electrode of the switching TFT, wherein the first and second electrodes of the capacitor are transparent.

10. A thin film transistor (TFT) image sensor of claim 9, wherein the storage capacitor is also a window of the image sensor.

* * * * *